(12) United States Patent
Beyerlein et al.

(10) Patent No.: US 9,817,033 B2
(45) Date of Patent: Nov. 14, 2017

(54) HIGH-VOLTAGE MEASUREMENT DIVIDER

(71) Applicant: Siemens Aktiengesellschaft, München (DE)

(72) Inventors: Walter Beyerlein, Bubenreuth (DE); Richard Eichhorn, Hirschaid Seigendorf (DE)

(73) Assignee: Siemens Aktiengesellschaft, München (DE)

( * ) Notice: Subject to any disclaimer, the term of this patent is extended or adjusted under 35 U.S.C. 154(b) by 134 days.

(21) Appl. No.: 14/827,914

(22) Filed: Aug. 17, 2015

(65) Prior Publication Data
US 2016/0054358 A1 Feb. 25, 2016

(30) Foreign Application Priority Data
Aug. 22, 2014 (DE) .................. 10 2014 216 732

(51) Int. Cl.
*G01R 19/00* (2006.01)
*G01R 15/04* (2006.01)
*H05G 1/26* (2006.01)
*G01R 15/06* (2006.01)

(52) U.S. Cl.
CPC ......... *G01R 15/04* (2013.01); *G01R 19/0084* (2013.01); *H05G 1/265* (2013.01); *G01R 15/06* (2013.01)

(58) Field of Classification Search
CPC ............ H05G 1/265; H05G 1/06; H05G 1/32; H05G 1/46; H05G 1/58; H05G 1/44; H05G 1/08; H05G 1/60; H02M 1/088; H02M 2001/0077; H02M 7/53806; H02M 3/337; H02M 7/53873; H02M 1/08; G01N 2223/076; G01N 23/223; G01R 19/0084; G01R 15/04; H05K 1/0254; H05K 1/18; H05K 2201/0792
See application file for complete search history.

(56) References Cited

U.S. PATENT DOCUMENTS

| | | | | | |
|---|---|---|---|---|---|
| 4,504,895 | A | * | 3/1985 | Steigerwald | H02M 3/3376 363/132 |
| 4,614,999 | A | * | 9/1986 | Onodera | H05G 1/32 363/28 |
| 5,023,769 | A | * | 6/1991 | Beland | H02M 7/1557 323/370 |

FOREIGN PATENT DOCUMENTS

DE 19537155 A1 4/1997
DE 102005036512 A1 2/2006

OTHER PUBLICATIONS

German Office Action for German Application No. 10 2014 216 732.9, dated Mar. 19, 2015 with English Translation.

* cited by examiner

*Primary Examiner* — Vinh Nguyen
(74) *Attorney, Agent, or Firm* — Lempia Summerfield Katz LLC

(57) ABSTRACT

A high-voltage measurement divider for an X-ray tube is provided. The high-voltage measurement divider includes a ground connection, a high-voltage connection, a measuring tap, and divider modules of substantial identical design apart from the circuitry. Each of the divider modules has a first connection, a second connection, a resistor board, and at least one flat potential electrode. The divider modules are connected at corresponding connections in series between the ground connection and the high-voltage connection. At least one division stage is formed by each of the divider modules, and a first division stage is formed between the measuring tap and the ground connection.

12 Claims, 3 Drawing Sheets

HIGH-VOLTAGE MEASUREMENT DIVIDER

This application claims the benefit of DE 10 2014 216 732.9, filed on Aug. 22, 2014, which is hereby incorporated by reference in its entirety.

BACKGROUND

The present embodiments relate to a high-voltage measurement divider.

In X-ray installations, X-ray tubes that require, for example, over 150 kV for generating X-ray radiation are increasingly used. Such X-ray tubes are not divided in ground-symmetrical fashion between the cathode and the anode. Instead, X-ray tubes that are operated in single-pole fashion (e.g., the anode is at the ground potential) are being used increasingly often.

For example, X-ray tubes that are used for computed tomography have a rotary anode in order to be able to distribute the heat produced from the high absorbed electron energy more effectively over the anode during operation. Single-pole operation of the X-ray tube has the advantage, inter alia, that involved insulation of the motor of the rotary anode, with respect to the surrounding environment at ground potential, may be dispensed with.

Single-pole operation of an X-ray tube places more stringent requirements on the dielectric strength of the voltage measurement, however, due to the higher potential difference with respect to ground. In order to measure the voltage across an X-ray tube, a high-voltage measurement divider that divides a high voltage present at two ends of the X-ray tube into individual division stages, in accordance with a known ratio, may be used. Therefore, a conclusion may be drawn with respect to the total voltage drop between the two ends from the voltage measured at the ends of a division stage.

While a resistive voltage division is used to measure the DC voltage component, the division stages of a high-voltage measurement divider may also have a capacitive voltage division in order to be able to precisely detect radiofrequency components of the voltage (e.g., in the case of switch-on operations or else voltage fluctuations (ripple)).

In the case of the capacitive components, however, a sufficient dielectric strength is to be provided. While a dielectric strength of the high-voltage measurement divider of 100 kV is in most cases sufficient during ground-symmetrical operation with tolerances, the high-voltage measurement divider is to be designed for an applied voltage that is twice as high in the case of a single-pole X-ray tube. Since, however, there is often only a limited amount of physical space available in an X-ray installation, a high-voltage measurement divider may not be enlarged as desired. For example, the addition of capacitors that may withstand high voltages may not be possible for reasons of space.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a high-voltage measurement divider with as high a dielectric strength as possible given a design that is as simple as possible is provided.

A high-voltage measurement divider (e.g., for an X-ray tube) is provided. The high-voltage measurement divider includes a ground connection, a high-voltage connection, and a measuring tap. A first division stage is formed between the measuring tap and the ground connection. In accordance with the one or more of the present embodiments, the high-voltage measurement divider may also include a plurality of divider modules of substantially identical design apart from the circuitry. Each divider module of the plurality of divider modules has a first connection, a second connection, a resistor board and at least one flat potential electrode. The plurality of divider modules are connected at corresponding connections in series between the ground connection and the high-voltage connection. At least one division stage is formed by each divider module.

A high-voltage measurement divider that is used for measuring the voltage across an X-ray tube may have capacitive elements in the division stages for detecting radiofrequency components of a voltage signal. In order to be able to enlarge the operational voltage range for the high-voltage measurement divider, sufficient dielectric strength may be provided (e.g., for the capacitive elements).

The concept of arranging a resistor board and at least one potential electrode in each divider module makes it possible to bring about capacitive coupling between the potential electrode and the resistor board, by a corresponding arrangement in relation to one another. A division stage via the circuitry that has a capacitive element and, in the form of the resistor board, a resistive element may thus be achieved. Via the dual function of the resistor board, each divider module may have a particularly compact construction. Owing to the series circuit of divider modules of same design, additional division stages may be added. Resistive and/or capacitive contributions of the divider modules are substantially same, thus considerably reducing the development complexity involved. Via the division of the voltage between a plurality of division stages, the number of divider modules may be selected such that the voltage drop across each individual divider module does not exceed the dielectric strength of the divider module.

The resistor board has a first end, a second end opposite the first end, and a tap point in each divider module. The tap point with respect to the resistance per unit area of the resistor board is arranged in the vicinity of the first end. The resistor board is interconnected with the first connection at the tap point or at the first end, is connected directly to a first base point of the at least one potential electrode at the second end, and is arranged in the vicinity of the at least one potential electrode such that, as a result, a capacitive coupling is produced.

An interconnection of two component parts may be an electrically conductive, possibly switchable connection that has no notable resistance. This connection may, for example, also have connection contacts to further component parts. For example, the arrangement of the at least one potential electrode may be parallel to the resistor board or slightly inclined with respect thereto. Via the capacitive coupling produced between the resistor board and the potential electrode, which is connected directly to the resistor board, each surface element of the resistor board with a surface element of the potential electrode that is in the vicinity (e.g., opposite) makes a capacitive contribution. The capacitive contributions in parallel with one another may be combined in an equivalent circuit diagram to form a capacitance that is effective in parallel with the resistance of the resistor board. As a result, a capacitive and resistive division stage is formed.

The second connection may be formed by a second base point of the at least one potential electrode in each divider module. The second base point is opposite the first base point. Simple interconnection of successive modules is thus enabled. For example, the first connection of a module is connected to the first end or the tap point arranged in the vicinity thereof of the resistor board. The resistor board may be connected at least approximately parallel to the potential electrode and to the potential electrode at the second end to the first base point thereof. A second base point, which is opposite the first base point, as connection for a subsequent module is advantageous from the point of view of the spatial arrangement.

In one embodiment, the resistor board is interconnected at the tap point with the measuring tap in the first divider module with respect to the ground connection and is interconnected at the first end with the first connection. The first connection is connected directly to the ground connection. Accordingly, a voltage drop between the tap point and the first end of the resistor board may be tapped off at the measuring tap and at the ground connection.

In one embodiment, the resistor board of the first divider module is connected at the tap point directly to a free potential electrode. The free potential electrode, facing away from the first divider module, is arranged in the vicinity of the resistor board such that, as a result, a capacitive coupling is produced. For example, the arrangement may be parallel or slightly inclined with respect to a parallel, and, for example, the free potential electrode may be arranged parallel to the potential electrode of the first divider module. Via the capacitive coupling between the free potential electrode and the resistor board, in conjunction with the resistance that becomes effective between the first end and the tap point of the resistor board, a first division stage is formed. The voltage drop across the first division stage may be tapped off at the measuring tap and at the ground connection.

Via the capacitive coupling between the resistor board and the at least one potential electrode of the first division module that faces away from the free potential electrode that becomes active as capacitance, and owing to the parallel resistance of the resistor board that is effective between the tap point and the second end and is in parallel with the effective capacitance, a second division stage is formed.

In one embodiment, a capacitive coupling exists between, in each case, two series-connected divider modules via the at least one potential electrode of a divider module being arranged in the vicinity of the resistor board of the following divider module. A particularly compact design is thus enabled, making it possible for a division stage to be formed in each case by a resistor board and only one potential electrode. As a result of this, further potential electrodes for capacitive coupling with a resistor board may be dispensed with.

The free potential electrode, facing away from the divider modules, may be shielded by a flat shielding electrode connected directly to the ground connection. Via shielding with respect to the surrounding environment by the shielding electrode, influences of the surrounding environment on the capacitive elements (e.g., on the capacitive coupling between the potential electrodes and the resistor boards of the high-voltage divider) may be reduced, stabilizing the division stages.

In one embodiment, each divider module has a further potential electrode. The further potential electrode is connected at a base point directly to the tap point or the first end of the resistor board and is arranged in the vicinity of the resistor board such that, as a result, a capacitive coupling is produced. For example, the arrangement may be parallel or slightly inclined with respect to a parallel, and, for example, the further potential electrode may be arranged in parallel with another potential electrode of the divider module, resulting in the introduction of the resistor board between the two parallel potential electrodes. The capacitive coupling between the further potential electrode and the resistor board provides a further capacitive contribution to the corresponding division stage formed by a capacitance and the effective resistance, depending on the circuitry of the resistor board.

In one embodiment, the resistor board of the first divider module with respect to the ground connection is connected at the tap point to the first base point of the further potential electrode. As a result, a first division stage is formed in the first divider module by the capacitive coupling between the potential electrode and the resistor board in conjunction with the resistor that becomes effective between the first end and the tap point of the resistor board. The voltage drop across the first division stage may be tapped off at the measuring tap and at the ground connection. A second division stage is formed by the resistance effective between the tap point and the second end of the resistor board, and the effective capacitance parallel thereto that results from the capacitive coupling between the resistor board and the potential electrode, which has the second connection of the division module.

In one embodiment, a number of divider modules are shielded by a flat shielding electrode connected directly to the first connection of the divider module. For example, the first divider module is shielded by such a shielding electrode. Via shielding with respect to the surrounding environment achieved by the shielding electrode, influences of the surrounding environment on the capacitive elements (e.g., on the capacitive coupling between the potential electrodes and the resistor boards of the high-voltage divider) may be reduced, stabilizing the division stages.

BRIEF DESCRIPTION OF THE DRAWINGS

Mutually corresponding parts and variables have been provided with the same reference symbols in each case in all of the figures.

DETAILED DESCRIPTION

Figure 1:
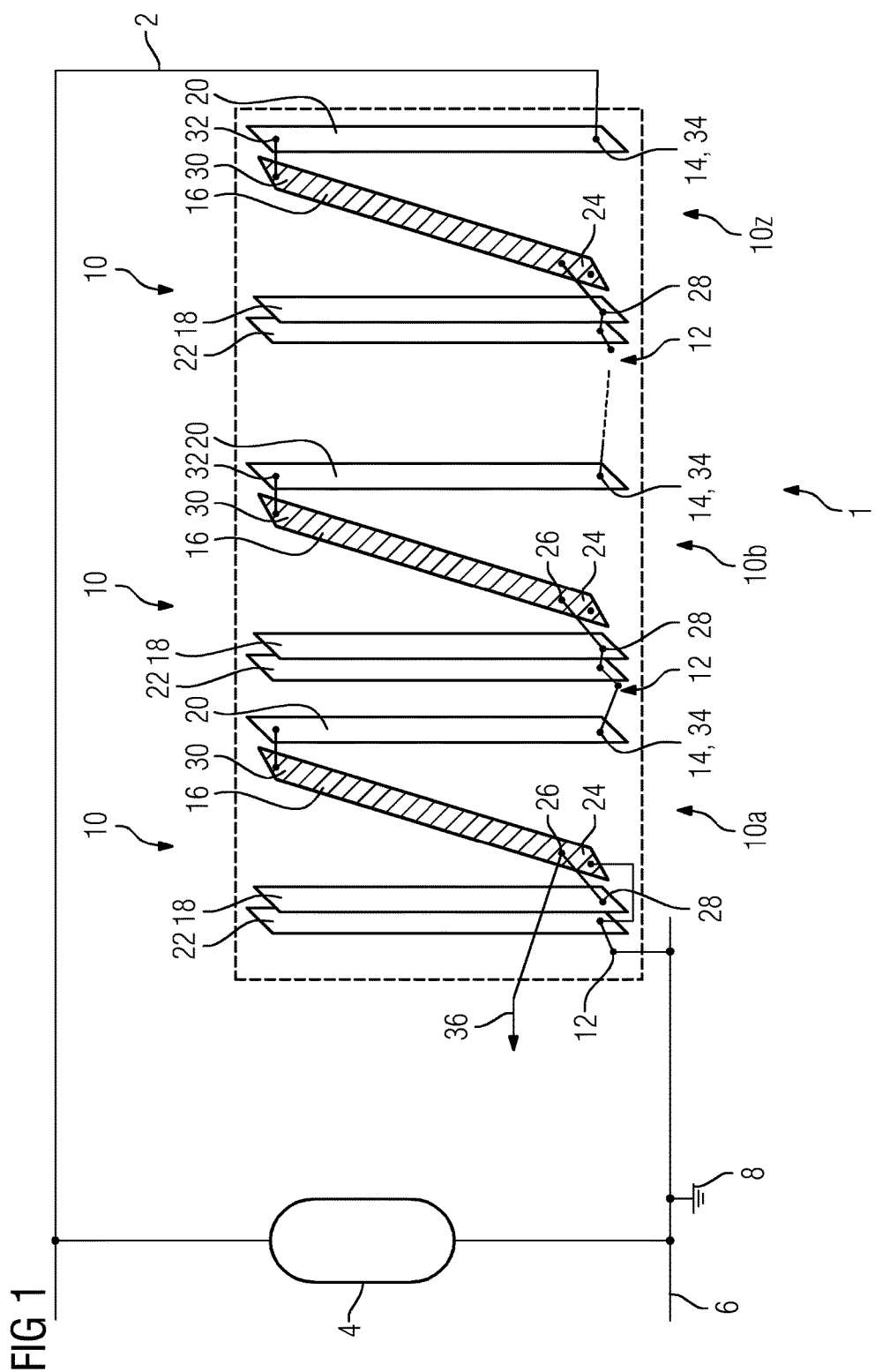
FIG. 1 depicts one embodiment of a high-voltage measurement divider including a cell-like structure in each divider module.

FIG. 1 depicts, schematically, one embodiment of a high-voltage measurement divider 1, connected to an X-ray tube 4 via a high-voltage connection 2. The high-voltage measurement divider 1 is connected to ground 8 at a ground connection 6. The X-ray tube 4 is also connected to ground 8. The high-voltage measurement divider 1 includes a plurality of divider modules 10, each with a substantially identical design (e.g., apart from circuitry). Each divider module 10 of the plurality of divider modules 10 includes a first connection 12, a second connection 14, a resistor board 16, a first potential electrode 18, a second potential electrode 20, and a shielding electrode 22.

The first divider module 10a is connected at a first connection 12 of the first divider module 10a to the ground connection 6. The second connection 14 of each divider module 10 is connected to the first connection 12 of the respectively following divider module 10, with the exception of the last divider module 10z in the series circuit. The second connection 14 of the last divider module 10z is connected to the high-voltage connection 2.

The shielding electrode 22 is connected directly to the first connection 12 in each divider module 10. The resistor board 18 has in each case a tap point 26 in the vicinity of a first end 24. The tap point is connected to a first potential electrode 18 that is parallel to the shielding electrode 22 at a base point 28. At the second end 30 opposite the first end 24, the resistor board 16 is connected directly to the first base point 32 of a second potential electrode 20. The potential electrodes 18, 20 are, for example, approximately parallel, and the resistor board 16 is arranged slightly inclined between the potential electrodes 18, 20. The second connection 14 is formed by a second base point 34 of the second potential electrode 20. The second base point 34 is opposite the first base point 32.

In the first divider module 10a, the shielding electrode 22 is connected to the first end 24 of the resistor board 16, with the result that a direct (e.g., practically resistance-free) interconnection of the first end 24 of the resistor board 18 with the ground connection 6 is achieved. At the tap point 26 of the resistor board 16 of the first divider module 10a, a measuring tap 36 is interconnected. In the divider modules 10b-10z following the first divider module 10a, the shielding electrode 22 is connected to the base point 28 of the first potential electrode 18, with the result that the first potential electrode 18 is interconnected directly (e.g., virtually resistance-free) with the first connection 12.

Figure 2:
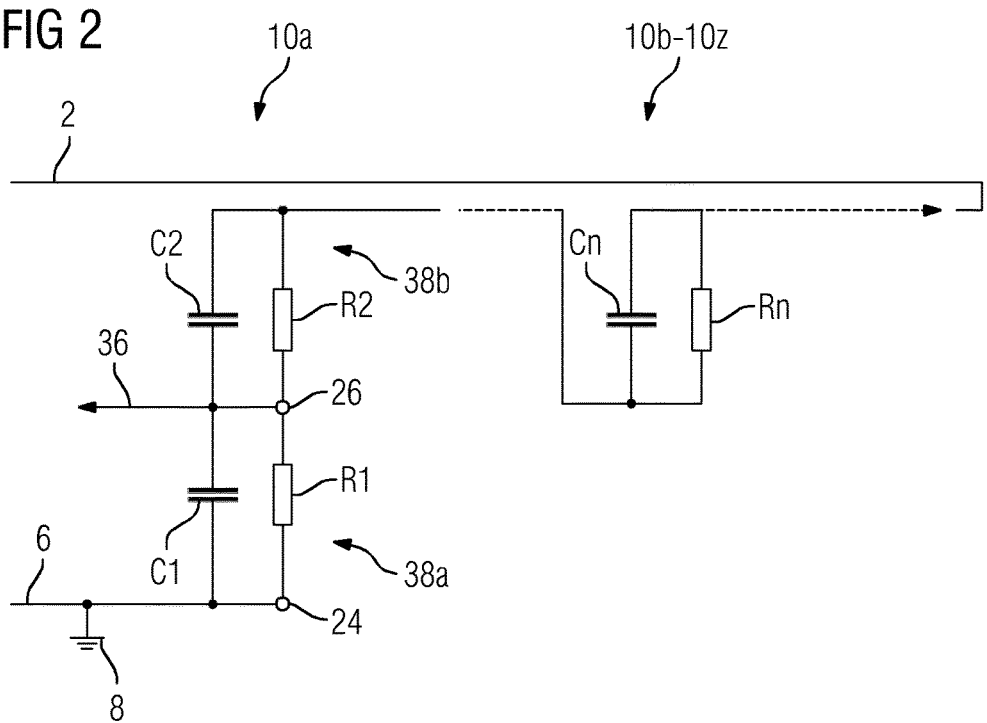
FIG. 2 depicts an equivalent circuit diagram of the high-voltage measurement divider shown in FIG. 1.

The mode of operation of the high-voltage measurement divider 1 becomes clear from the equivalent circuit diagram illustrated in FIG. 2. In the first divider module 10a, a voltage drop forms across the effective resistance R1 between the first end 24 and the tap point 26 of the resistor board 16. Owing to the physical arrangement of the first potential electrode 18 in the direct vicinity of the resistor board 16, a capacitive coupling in the form of a capacitance C1 also becomes effective. The effective resistance R1 between the first end 24 and the tap point 26 and the capacitance C1 that is in parallel therewith and is formed by the resistor board 16 and the first potential electrode 18 thus form a first division stage 38a, that may be tapped off between the measuring tap 36 and the ground connection 6 that is interconnected with the first end 24 via the first connection 12.

In the first divider module 10a, there is a voltage drop across an effective resistance R2 between the tap point 26 and the second end 30 of the resistor board 16. Owing to the physical arrangement of the second potential electrode 20 in the direct vicinity of the resistor board 16, in addition, a capacitive coupling in the form of a capacitance C2 becomes effective. The effective resistance R2 between the tap point 26 and the second end 30 and the capacitance C2 in parallel therewith and formed by the resistor board 16 and the second potential electrode 20 thus form a second division stage 38b.

In each further divider module 10b-10z, a resistance Rn becomes effective in the respective resistor board 16 between the tap point 26 and the second end 30. A voltage drop resulting from the voltage applied to the connections 12, 14 of the divider module 10b-10z forms across the resistance Rn. Owing to the physical arrangement of the resistor board 16 between the two potential electrodes 18, 20 in the direct vicinity thereof, a capacitive coupling results. Each surface element of the resistor board 16 and each surface element of a potential electrode 18 or 20 makes a capacitive contribution. These capacitive contributions in parallel with one another may be combined in the equivalent circuit diagram of the divider module 10b-10z to form a capacitance Cn that acts in parallel with the resistance Rn and forms a further division stage 38n therewith.

Owing to the repetitive arrangement of substantially structurally identical cells as division modules 10, a high dielectric strength (e.g., of the capacitances) may be achieved. The design makes it possible to add further cells with division modules 10, with capacitive or resistive contribution to the division stages 38 that does not need to first be determined by complex series of tests, but is known directly, in the event that a higher dielectric strength is required.

Figure 3:
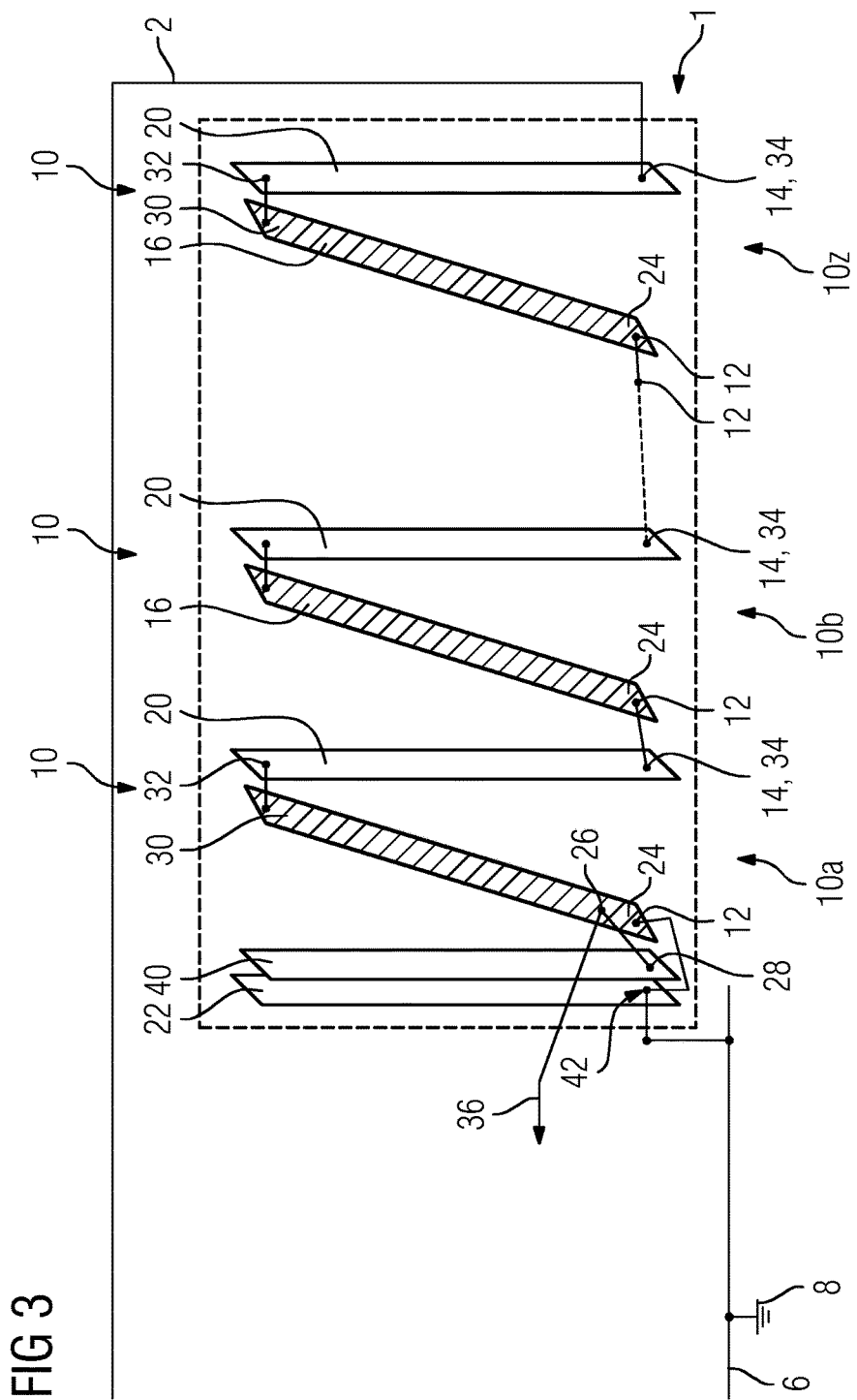
FIG. 3 depicts one embodiment of a high-voltage measurement divider in the form of a compact unit.

Another embodiment of a high-voltage measurement divider 1 is illustrated in FIG. 3. The individual divider modules 10 are each formed by a resistor board 16 and a potential electrode 18. The individual potential electrodes 20 of successive divider modules 10 are arranged approximately parallel to one another. The resistor boards 16 of successive divider modules 10 in an exemplary embodiment are slightly inclined with respect to the adjoining potential electrodes 20, and the resistor boards 16 likewise form parallel planes. A completely parallel arrangement of potential electrodes 20 and resistor boards 16 may also be provided.

The resistor board 16 of the first divider module 10a is connected at tap point 26 to a free potential electrode 40 and to the measuring tap 36. The first end 24 of the resistor board 16 forms the first connection 12 of the first divider module 10a and is connected to a shielding electrode 22 at the base point 42 thereof. The shielding electrode 22 is arranged parallel to the free potential electrode 40. The first end 24 of the resistor board 16 is also interconnected directly, (e.g., virtually resistance-free) with the ground connection 6 to ground 8 via the base point 42.

Each resistor board 16 is connected at second end 30 to the first base point 32 of the potential electrode 20, and the second base point 34 of the potential electrode 20 forms the second connection 14 of each divider module 10. The divider module 10 is interconnected with the first connection 12 of the following divider module 10b-10z or, in the case of the last divider module 10z, with the high-voltage connection 2. The first connection 12 of the following divider modules 10b-10z is formed in the exemplary embodiment in each case by the first end 24 of the respective resistor board 16 of the divider module 10b-10z. A connection at the respective first end 24 may also be provided.

A capacitance C1 is formed by the free potential electrode 40 and the resistor board 16 of the first divider module 10a. The capacitance is in parallel with the resistance R1 effective between the first end 24 and the tap point 26 of the resistor board 16. As a result, a first division stage 38a that may be tapped off at the ground connection 6 and at the measuring tap 36 is formed. The further division stages are formed in a similar way to the form illustrated in FIG. 1.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the invention has been illustrated and described in detail using the preferred exemplary embodiment, the invention is not restricted by this exemplary embodiment. Other variations may be derived from this exemplary embodiment by a person skilled in the art without departing from the scope of protection of the invention.

We claim:

1. A high-voltage measurement divider for an X-ray tube, the high-voltage measurement divider comprising:
    a ground connection;
    a high-voltage connection;
    a measuring tap; and
    a plurality of divider modules, the plurality of divider modules having a substantially identical design except for circuitry,
    wherein each divider module of the plurality of divider modules comprises a first connection, a second connection, a resistor board, and at least one flat potential electrode, the first connection, the second connection, the resistor board, and the at least one flat potential electrode being in electrical communication with each other,
    wherein the plurality of divider modules are connected in series between the ground connection and the high-voltage connection,
    wherein, in a first divider module of the plurality of divider modules, the resistor board is interconnected to the measuring tap, the first divider module being the divider module of the plurality of divider modules closest to the ground connection,
    wherein at least one division stage is formed by each divider module of the plurality of divider modules, and
    wherein a first division stage of the at least one division stage is formed between the measuring tap and the ground connection.

2. The high-voltage measurement divider of claim 1, wherein the resistor board has a first end, a second end opposite the first end, and a tap point in each divider module of the plurality of divider modules,
    wherein the tap point with respect to resistance per unit area of the resistor board is arranged in the vicinity of the first end, and
    wherein the resistor board is interconnected with the first connection at the tap point or at the first end, is connected directly at the second end to a first base point of the at least one flat potential electrode, and is arranged with respect to the at least one flat potential electrode such that a capacitive coupling is produced.

3. The high-voltage measurement divider of claim 2, wherein the second connection is formed by a second base point of the at least one flat potential electrode, and
    wherein the second base point is opposite the first base point in each divider module of the plurality of divider modules.

4. The high-voltage measurement divider of claim 2, wherein, in the first divider module of the plurality of divider modules, the resistor board is interconnected at the tap point to the measuring tap, and is interconnected at the first end to the first connection, and
    wherein the first connection is connected directly to the ground connection.

5. The high-voltage measurement divider of claim 3, wherein, in the first divider module of the plurality of divider modules, the resistor board is interconnected at the tap point to the measuring tap, and is interconnected at the first end to the first connection, and
    wherein the first connection is connected directly to the ground connection.

6. The high-voltage measurement divider of claim 4, wherein the resistor board of the first divider module of the plurality of divider modules is connected at the tap point directly to a free potential electrode,
    wherein the free potential electrode, facing away from the first divider module of the plurality of divider modules, is in electrical communication with the resistor board of the first divider module of the plurality of divider modules and arranged with respect to the resistor board of the first divider module of the plurality of divider modules such that a capacitive coupling is produced.

7. The high-voltage measurement divider of claim 6, wherein a capacitive coupling exists between in each case two series-connected divider modules of the plurality of divider modules via arrangement of the at least one flat potential electrode of a divider module of the plurality of divider modules with respect to the resistor board of the following divider module of the plurality of divider modules.

8. The high-voltage measurement divider of claim 6, wherein the free potential electrode, facing away from the first divider module of the plurality of divider modules, is shielded by a flat shielding electrode that is connected directly to the ground connection.

9. The high-voltage measurement divider of claim 7, wherein the free potential electrode, facing away from the first divider module of the plurality of divider modules, is shielded by a flat shielding electrode that is connected directly to the ground connection.

10. The high-voltage measurement divider of claim 4, wherein each divider module of the plurality of divider modules includes a further potential electrode,
    wherein each further potential electrode is connected at a base point directly to the tap point or the first end of each resistor board of each divider module of the plurality of divider modules, is in electrical communication with each resistor board of each divider module of the plurality of divider modules, and is arranged with respect to each resistor board of each divider module of the plurality of divider modules, respectively, such that a capacitive coupling is produced.

11. The high-voltage measurement divider of claim 10, wherein the resistor board of the first divider module with respect to the ground connection is connected at the tap point to the base point of the further potential electrode.

12. The high-voltage measurement divider of claim 11, wherein each divider module of the plurality of divider modules is shielded by a flat shielding electrode that is connected directly to the first connection of each divider module of the plurality of divider modules and is in electrical communication with each resistor board of each divider module of the plurality of divider modules, respectively.

* * * * *